Figure 1:
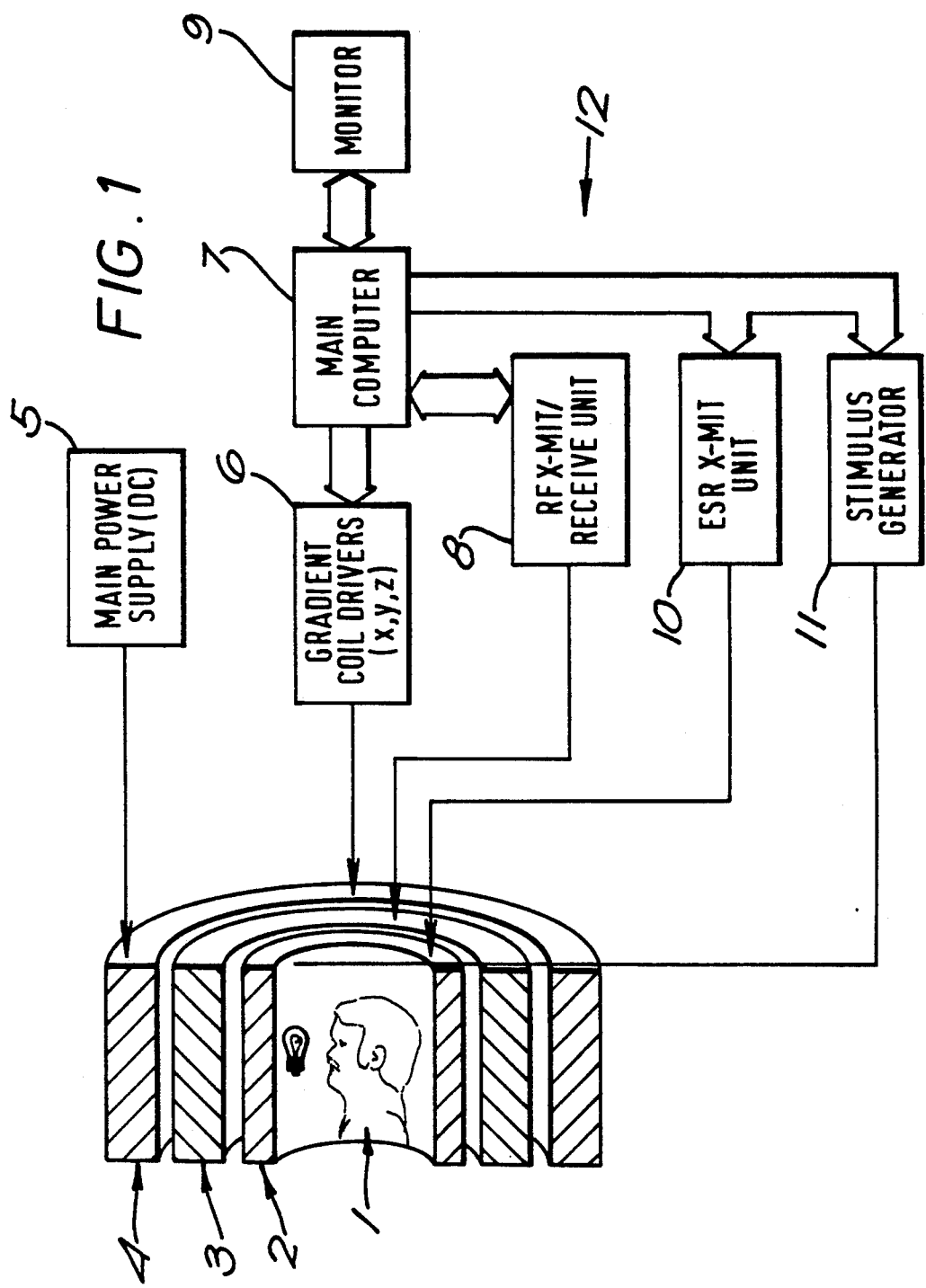

United States Patent [19]

Ehnholm

[11] Patent Number: 5,325,854
[45] Date of Patent: Jul. 5, 1994

[54] MAGNETIC RESONANCE IMAGING

[75] Inventor: Gosta J. Ehnholm, Helsinki, Finland

[73] Assignee: Instrumentarium Corporation, Helsinki, Finland

[21] Appl. No.: 789,992

[22] Filed: Nov. 12, 1991

[30] Foreign Application Priority Data

Nov. 12, 1990 [GB] United Kingdom ............... 9024528

[51] Int. Cl.⁵ .................................................. A61B 5/05
[52] U.S. Cl. ............................ 128/653.4; 128/653.2; 424/450
[58] Field of Search ............ 128/653, 654, 659, 653.4; 424/11, 4.9, 450

[56] References Cited

U.S. PATENT DOCUMENTS

| 4,656,026 | 4/1987 | Cottman et al. | 128/653.4 |
| 4,687,658 | 8/1987 | Quay | 128/653.4 |
| 4,728,575 | 3/1988 | Gamble et al. | 128/660 |
| 4,770,183 | 9/1988 | Groman et al. | 128/654 |
| 4,826,673 | 5/1989 | Dean et al. | 128/653.4 |
| 4,940,057 | 7/1990 | Kamei | 128/653.2 |
| 5,078,141 | 1/1992 | Suzuki et al. | 128/653.2 |
| 5,081,991 | 1/1992 | Chance | 128/653.2 |

FOREIGN PATENT DOCUMENTS

| 0302742 | 2/1989 | European Pat. Off. |
| 0375074 | 12/1989 | European Pat. Off. |
| 9002343 | 3/1990 | European Pat. Off. |
| 9112024 | 8/1991 | European Pat. Off. |
| 9000904 | 2/1990 | United Kingdom |
| 9002345 | 3/1990 | United Kingdom |
| 9007719 | 7/1990 | United Kingdom |
| 8810419 | 12/1988 | World Int. Prop. O. |

OTHER PUBLICATIONS

Cafiso, Ann Rev Biophys Bioeng 10: 217–244 (1981).
Holder, pp. 339–354 in "PET and MMR: New Perspectives ...", Alan Liss, 1969.
Grucker, Magn. Reson. Med. 14: 140–147 (1990).

Primary Examiner—C. Fred Rosenbaum
Assistant Examiner—Chalin Smith

[57] ABSTRACT

There is provided a method of electron spin resonance enhanced magnetic resonance imaging of a human or non-human animal body, characterised in that said method comprises administering to said body a physiologically tolerable ionic or ionizable paramagnetic substance capable of associating with a cell membrane lipid.

18 Claims, 2 Drawing Sheets

MAGNETIC RESONANCE IMAGING

The invention relates to improvements in and relating to magnetic resonance imaging (MRI) and more particularly to a method of diagnostic imaging of electromagnetic events by electron spin resonance enhanced magnetic resonance imaging (ESREMRI).

The phenomenon of dynamic nuclear polarization, the so-called Overhauser effect, has recently been utilised to enhance the amplitude of the nuclear magnetic resonance signal (the FID or free induction delay signal) in the diagnostic imaging technique of magnetic resonance imaging. This modification of MRI has been variously termed electron spin resonance enhanced magnetic resonance imaging (ESREMRI), Overhauser magnetic resonance imaging (OMRI) and proton electron double resonance imaging (PEDRI). The technique involves exposing the sample to be imaged to radiation (hereinafter referred to as VHF radiation) of a frequency selected to stimulate esr transitions in a paramagnetic substance, for example a nitroxide stable free radical, within the sample. Interaction between the stimulated electron spin system and the nuclear spin system of the nuclei (generally water protons) responsible for the FID signals from which the MR image is generated causes a relative overpopulation of the excited state of the nuclear spin system and as a result an increase in the magnitude of the FID signals. This increase in signal strength can be utilised in a number of ways - to allow the imaging apparatus to be constructed with a lower than conventional field strength primary magnet, to allow increased image quality to be obtained, to allow image acquisition time to be reduced, or a combination of these. Image acquisition time may be reduced still further by employing in ESREMRI fast imaging techniques developed for conventional MRI, for example echo planner imaging.

ESREMRI techniques have been described in the patent and technical literature by Leunbach et al, Lurie et al, and Grucker et al for example in WO-A-88/10419 (Leunbach), EP-A-355884 (Leunbach), WO-A-90/07719 (Leunbach) J Magn Reson 76:336-370(1988) (Lurie), EP-A-302742 (Lurie), Magn. Resort. Med. 14:140-147(1990) (Grucker) and in the Abstracts of the Society for Magnetic Resonance in Medicine (SMRM) seventh eighth and ninth annual meetings 1988, 1989, 1990.

We now propose the use of an ESREMRI technique in imaging of biological electromagnetic activity, in particular for imaging of membrane activity potentials, eg in the nervous system and in particular in the CNS, for example the brain and the spinal chord.

Detection of electrical activity in the body is of particular interest medically, for example in the spatial mapping of brain function, the detection of metabolic activity, and the localisation or observation of dysfunction.

There is a need for imaging modalities capable of fine temporal and spatial resolution in the observation of such activity. At present the apparatus available is not generally capable of particularly good temporal and spatial resolution, for example resolution of the order of several milliseconds and several millimetres respectively.

Some imaging techniques, for example *positron emission tomography* (PET), may be used to produce images of the brain which depict its metabolic activity but with a temporal resolution of the order of minutes. Another technique for detecting biological electromagnetic activity involves the use of magnetometers comprising arrays of superconducting quantum interference devices (SQUIDS). SQUID magnetometers are capable of measuring magnetic fields of as low as $10^{-14}$ Tesla and so are able to detect the magnetic fields associated with neuronal firing. Moreover SQUIDs are capable of doing this in real time and recent research with SQUIDs has indicated that the ability to follow neuronal activity in real time will be of great importance in diagnosing brain disorders. While SQUID arrays can accurately pinpoint a single magnetic event, they are however less readily arranged for generation of images depicting more spatially extended multiple events. Moreover the availability of SQUID based apparatus for routine medical diagnosis is extremely limited at present.

The present invention is based on the realisation that if in ESREMRI a paramagnetic species is administered which modifies its affect on the FID signal enhancement in response to biological electromagnetic activity, imaging, including dynamic imaging, of that activity is possible. This will be the case where the paramagnetic species carries an electrical charge and has a hydrophobic (i.e. lipophilic) moiety which enables it to associate with the lipid layer of cell membranes.

Thus viewed from one aspect the invention provides a method of electron spin resonance enhanced magnetic resonance imaging of a human or non-human animal, preferably mammalian, body, characterised in that said method comprises administering to said body, preferably parenterally, a physiologically tolerable ionic or ionizable paramagnetic substance capable of associating with a cell membrane lipid.

The paramagnetic substance capable of associating with the cell membrane lipid is preferably a material having an esr transition which, when stimulated with VHF radiation in the ESREMRI procedure produces a FID signal enhancement; i.e. it is preferably a material having a relatively narrow esr linewidth (e.g. less than 1 Gauss ($10^{-4}$ Tesla), preferably less than 0.5 Gauss and especially preferably less than 0.05 Gauss) e.g. a triarylmethyl free radical as described in WO-A-91/12024. However in one embodiment of the invention at least two paramagnetic substances are administered to the subject, at least one serving to enhance the FID signal and at least one other serving to diminish the FID signal enhancement, e.g. a combination of broad and narrow esr linewidth paramagnetic materials, for example a combination of a narrow linewidth stable free radical and a broader linewidth material (e.g. a paramagnetic metal containing molecule or ion, preferably a chelate complex). Where a FID signal enhancer and a FID enhancement suppressor are administered then either can provide the charged paramagnetic species which associates with the membrane lipids since biological electromagnetic activity will alter the relative local concentrations and proximities of the FID enhancer and suppressor and hence the FID enhancement in the environment of an electromagnetic event, e.g. neuronal firing. Where only one paramagnetic substance is administered however this will preferably be a FID signal enhancer.

Thus viewed from a further aspect the invention also provides a diagnostic magnetic resonance imaging composition comprising a physiologically tolerable stable free radical together with a physiologically tolerable parmagnetic metal chelate complex, one of which being ionic in aqueous solution and one of which having a broader esr linewidth than the other.

As discussed by Holder in "PET and NMR: New Perspectives in Neuroimaging and Clinical Neurochemistry" Alan R Liss 1969, pages 339-354 and by Cafiso and Hubbell in Ann Rev Biophys Bioeng 10:213-244 (1981), the esr linewidth of a paramagnetic substance such as a charged stable free radical is dependant on the location within the biological tissue of the substance, the linewidth increasing (and hence for ESREMRI the FID enhancement decreasing) as the substance is brought into a lipid environment, e.g. the cell membrane. Since with a charged lipophilic paramagnetic substance alterations in membrane potentials, e.g. as a result of biological electromagnetic events, will result in alterations of the distribution of the substance in, at or across the membrane, biological electromagnetic activity will produce a direct and detectable response in the FID signal in the ESREMRI technique.

The charged amphiphilic paramagnetic substance used in the method of the present invention will preferably be a narrow esr linewidth stable free radical, e.g. a conventional esr spin label which has or is provided with an ionizable grouping, such as for example the phosphonium groups used by Cafiso et al. (supra). However a charged, amphiphilic broad esr linewidth, paramagnetic metal chelate might be used in the method of the invention in conjunction with a hydrophilic narrow esr linewidth stable free radical, the first serving to suppress the FID signal enhancement of the second to a greater or lesser extent depending on the membrane activity potential. Such a paramagnetic metal chelate may conveniently be a chelate of a paramagnetic transition metal (eg Fe(III) or Mn(II)) or a paramagnetic lanthanide ion (e.g. Gd(III), Dy(III), Ho(III), etc) with a chelant which possesses a pendant hydrophobic moiety, eg a long chain (for example $C_6$-$C_{20}$ alkyl group, for example a Gd(III) chelate of a DTPA-alkylamide. Alternatively a charged amphiphilic narrow esr linewidth paramagnetic substance, e.g. a stable free radical can be used in conjunction with a water-soluble broader esr linewidth paramagnetic substance, e.g. a paramagnetic chelate such as Gd(III)HP-DO3A for example. In any event the esr and MRI literature provides many examples of stable free radical spin labels and paramagnetic metal chelates suitable for use in the membrane potential imaging method of the invention.

The charged amphiphilic paramagnetic substance, due to its amphiphilic nature, will distribute at a lipid/aqueous interface and, due to the presence of the charge carrying group, it will alter its distribution according to the potential profile of its environment as a result it will distribute in and around a neuron differently before and after neuron firing. The difference in the distribution will, if the charged amphiphilic species is a FID signal enhancer in ESREMRI, result in a modification of the local FID signal enhancement due for example to changes in the esr linewidth or frequency due to changes in the paramagnetic species environment. Where the charged amphiphilic species is a suppressor of FID signal enhancement by another paramagnetic species the differences in its distribution will give rise to differences in the extent to which it can suppress that FID signal enhancement. Where, using a FID signal enhancer as the charged amphiphilic paramagnetic substance, another paramagnetic substance is dissolved into the extracellular space in a high enough concentration to broaden the esr linewidth of the FID signal enhancer, the degree of FID signal enhancement realised will again depend upon the distribution of the FID signal enhancer with respect to the cell membrane and this will change with local electromagnetic activity.

In the method of the invention, the paramagnetic substances will generally be injected in quantities comparable to those used for conventional x-ray or MRI contrast media, e.g. 0.001-10 mmol/kg, especially 0.01-5 mmol/kg.

The electromagnetic activity that is imaged may be naturally occurring or may alternatively be triggered by exposure of the subject to some stimulus, for example visual, tactile or auditory.

In order to pick out the electromagnetic activity, the ESREMRI image may be manipulated to present a different image, e.g. by subtraction of a pre-stimulus image or a time averaged image. This can be performed in a straightforward manner by conventional techniques.

Viewed from a further aspect, the invention also provides an ESREMRI apparatus arranged for imaging biological electromagnetic activity, preferably for imaging electrical activity in the nervous system, characterised in that said apparatus is provided with means for manipulating the detected FID signals to generate an image representative of temporal and spatial variations in FID signal enhancement.

The apparatus of the invention, which in its simplest form may take the form of conventional ESREMRI apparatus programmed to perform the desired data manipulation, is also preferably provided with means for subjecting the patient being imaged to a stimulus, e.g. a light or sound emitter.

Figure 2:
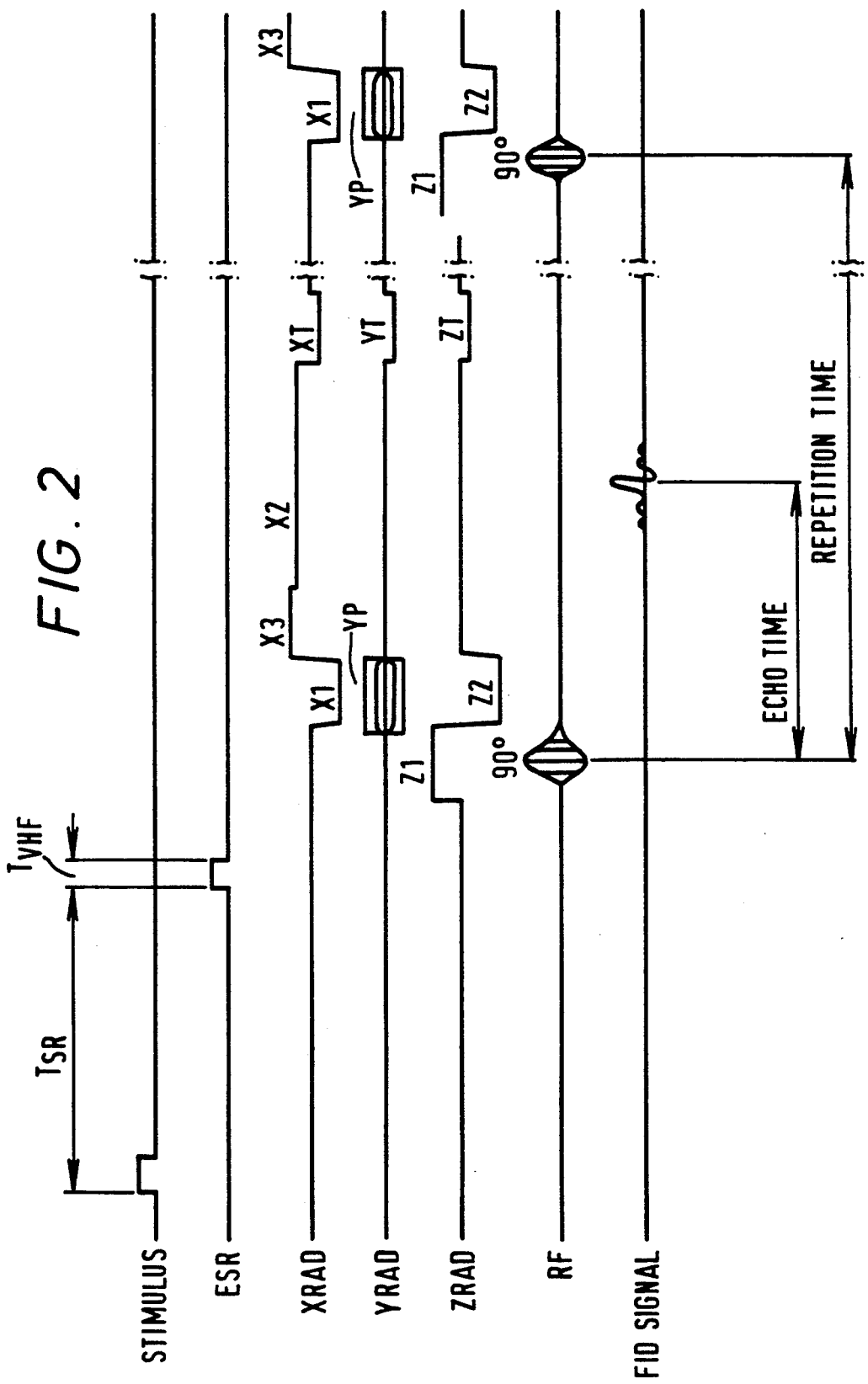

Embodiments of the invention will now be described by way of example with reference to the accompanying drawings, in which:

FIG. 1 is a schematic representation of apparatus according to the invention; and FIG. 2 is a schematic representation of the ESREMRI timing sequence for an imaging method according to the invention.

Referring to FIG. 1 there is shown a ESREMRI apparatus arranged to image brain electrical activity in a subject 1. Subject 1, to whom a charged amphiphilic paramagnetic substance has been administered parenterally, is disposed with the head within a VHF coil 2 arranged to emit VHF radiation of a frequency $F_e$ selected to excite esr transitions in the paramagnetic substance. This radiation is passed to coil 2 from VHF pulse generator 10. Disposed around coil 2 is a RF transceiver coil 3 arranged to emit and detect RF radiation for the generation of a magnetic resonance image of the subject. Also disposed about the subject are magnetic field generating coils 4 arranged to generate the primary magnetic field $B_o$ and also the time variant magnetic field gradients in the x, y and z directions. The magnetic field generating coils are energised by a power supply 5 and the timing and magnitudes of the field gradients are controlled by current drivers 6 themselves controlled by computer 7. The computer 7 controls the imaging apparatus and, through RF transceiver unit 8 which generates RF pulses and receives and digitizes the detected RF signal and transmits this data to the computer, it manipulates the FID signals detected by transceiver 3 in order to generate an image which may be displayed on monitor console 9. Monitor console 9 is also arranged to permit the operator of the apparatus to control the computer and inspect the measured and processed data.

Electrical activity in the brain of subject 1 is provoked by stimulus generator 11 which is arranged to emit a burst of sound or light or in some other way to stimulate a response.

The performance of the method of the invention using such apparatus may be illustrated by the timing diagram of FIG. 2 for the simple case of forming an image of local neuronal activity in a plane perpendicular to the z axis. The image would represent the electrical activity during time $T_{VHF}$ starting at a time $T_{SR}$ after the onset of the stimulus.

The stimulus, typically a burst of sound, a flickered image or the like, triggers neuronal responses in the brain, responses which affect the cell membrane potential so altering the distribution of the charged amphiphilic paramagnetic substance and hence the local extent of FID signal enhancement by the Overhauser effect. This may be for example by broadening (or shifting) the esr transition stimulated by the VHF radiation - such broadening would usually result in a reduction in dynamic nuclear polarisation. Thus in effect the local FID signal enhancement for one imaging pulse sequence will depend on the local neuron activity during time period $T_{VHF}$.

The FID signal may be read out and transformed into an image using conventional imaging pulse sequences and signal manipulation techniques. FIG. 2 illustrates the case of a saturation - recovery sequence. The protons in a slice through the subject are excited by the combination of magnetic field gradient $Z_1$ and a selective 90° RF pulse. Magnetic field gradients in the x direction are used to form the spin echo FID signal using the gradient reversal method and with the x-direction being frequency coded by gradient $X_2$ during echo signal sampling (detection). The y-direction is phase coded using gradient $Y_p$, which takes a different value in each repetition of the pulse/detection sequence. Thus for a 256×256 pixel image the pulse/detection sequence is repeated 256 times - this automatically ensures that the response is repeated enough times to average out the effect of spontaneous brain activity.

While the method has been discussed with particular reference to brain activity imaging, it is of course equally applicable to imaging other regions of the body in which electromagnetic events occur, e.g. in imaging of the heart where neuronal signals are strong and repetitive. In such a case, imaging may be synchronised to an electrocardiogram signal without need for an external stimulus generator.

I Claim:

1. A method of electron spin resonance enhanced magnetic resonance imaging of repetitive biological electromagnetic activity in a human or non-human animal body, said method comprising the steps of administering to said body a physiologically tolerable paramagnetic substance capable of associating with a cell membrane lipid, the paramagnetic substance being selected from the group comprising ionic or ionisable materials, and synchronizing magnetic response signal generation and detection with said repetitive biological electromagnetic activity.

2. A method as claimed in claim 1 wherein said substance is administered parenterally.

3. A method as claimed in claim 1 wherein said substance has an esr linewidth of less than $10^{-4}$ Tesla.

4. A method as claimed in claim 3 wherein said substance is a triarylmethyl stable free radical.

5. A method as claimed in claim 1 wherein there is administered to said body a stable free radical and a paramagnetic metal chelate complex.

6. A method as claimed in claim 1 wherein there is administered to said body a charged amphiphilic paramagnetic substance.

7. A method as claimed in claim 1 wherein said substance is administered at a dosage of 0.001-10 mmol/kg.

8. A method as claimed in claim 1 comprising administering to said body a physiologically tolerable hydrophilic stable free radical and physiologically tolerable charged paramagnetic metal chelate.

9. A method as claimed in claim 1 comprising administering to said body a physiologically tolerable charged amphiphilic stable free radical and a physiologically tolerable uncharged paramagnetic metal chelate.

10. A method of electron spin resonance enhanced magnetic resonance imaging of repetitive biological electromagnetic activity in a human or non-human animal body, said method comprising administering to said body a physiologically tolerable paramagnetic substance capable of associating with a cell membrane lipid, the paramagnetic substance being selected from a group of such materials which are ionic or ionisable, subjecting the animal body to a stimulus to provoke the biological electromagnetic activity, and detecting said biological electromagnetic activity.

11. A method as claimed in claim 10 wherein said substance is administered parenterally.

12. A method as claimed in claim 10 wherein said substance has an esr linewidth of less than $10^{-4}$ Tesla.

13. A method as claimed in claim 12 wherein said substance is a triarylmethyl stable free radical.

14. A method as claimed in claim 10 wherein there is administered to said body a stable free radical and a paramagnetic metal chelate complex.

15. A method as claimed in claim 10 wherein there is administered to said body a charged amphiphilic paramagnetic substance.

16. A method as claimed in claim 10 wherein said substance is administered at a dosage of 0.001-10 mmol/kg.

17. A method as claimed in claim 10 comprising administering to said body a physiologically tolerable hydrophilic stable free radical and a physiologicaly tolerable charged paramagnetic metal chelate.

18. A method as claimed in claim 10 comprising administering to said body a physiologically tolerable charged amphiphilic stable free radical and physiologically tolerable uncharged paramagnetic metal chelate.

* * * * *

UNITED STATES PATENT AND TRADEMARK OFFICE
CERTIFICATE OF CORRECTION

PATENT NO. : 5,325,854
DATED : July 5, 1994
INVENTOR(S) : Gosta J. Ehnholm

It is certified that error appears in the above-indentified patent and that said Letters Patent is hereby corrected as shown below:

Column 1, line 44, "Resort." should read --Reson.--.

Column 6, line 1, "response" should read --resonance--.

Signed and Sealed this

Second Day of July, 1996

Attest:

BRUCE LEHMAN

Attesting Officer

Commissioner of Patents and Trademarks